(12) United States Patent
Aono et al.

(10) Patent No.: US 11,430,727 B2
(45) Date of Patent: Aug. 30, 2022

(54) CERAMIC CIRCUIT SUBSTRATE

(71) Applicant: DENKA COMPANY LIMITED, Tokyo (JP)

(72) Inventors: Ryota Aono, Omuta (JP); Fumihiro Nakahara, Omuta (JP); Kouji Nishimura, Omuta (JP); Yuta Tsugawa, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 5 days.

(21) Appl. No.: 16/619,414

(22) PCT Filed: Jun. 7, 2018

(86) PCT No.: PCT/JP2018/021810
§ 371 (c)(1),
(2) Date: Dec. 4, 2019

(87) PCT Pub. No.: WO2018/225809
PCT Pub. Date: Dec. 13, 2018

(65) Prior Publication Data
US 2020/0185320 A1 Jun. 11, 2020

(30) Foreign Application Priority Data
Jun. 9, 2017 (JP) .............................. JP2017-113946

(51) Int. Cl.
*H01L 23/373* (2006.01)
*H01L 23/498* (2006.01)
(Continued)

(52) U.S. Cl.
CPC ........ *H01L 23/49866* (2013.01); *C23C 18/42* (2013.01); *H01L 21/4853* (2013.01);
(Continued)

(58) Field of Classification Search
CPC .......... H01L 2224/29139; H05K 3/181; H05K 2203/072; H05K 3/244
See application file for complete search history.

(56) References Cited

U.S. PATENT DOCUMENTS

2006/0147746 A1 7/2006 Wakako et al.
2015/0173190 A1 6/2015 Murakami et al.
(Continued)

FOREIGN PATENT DOCUMENTS

EP 1 670 295 A2 6/2006
JP 2011-080147 A 4/2011
(Continued)

OTHER PUBLICATIONS

Aug. 21, 2018 International Search Report issued in International Patent Application No. PCT/JP2018/021810.
(Continued)

*Primary Examiner* — Shahed Ahmed
*Assistant Examiner* — Sun Mi Kim King
(74) *Attorney, Agent, or Firm* — Oliff PLC

(57) ABSTRACT

A ceramic circuit substrate is suitable for silver nanoparticle bonding of semiconductor elements and has excellent close adhesiveness with a power module sealing resin. A ceramic circuit substrate has a copper plate bonded, by a braze material, to both main surfaces of a ceramic substrate including aluminum nitride or silicon nitride, the copper plate of at least one of the main surfaces being subjected to silver plating, wherein: the copper plate side surfaces are not subjected to silver plating; the thickness of the silver plating is 0.1 μm to 1.5 μm; and the arithmetic mean roughness Ra of the surface roughness of the circuit substrate after silver plating is 0.1 μm to 1.5 μm.

10 Claims, 1 Drawing Sheet

(51) Int. Cl.
  *C23C 18/42* (2006.01)
  *H01L 21/48* (2006.01)
  *H01L 23/15* (2006.01)
  *H01L 23/00* (2006.01)

(52) U.S. Cl.
  CPC .......... *H01L 23/15* (2013.01); *H01L 23/3735* (2013.01); *H01L 24/29* (2013.01); *H01L 24/32* (2013.01); *H01L 2224/29139* (2013.01); *H01L 2224/32225* (2013.01); *H01L 2224/32501* (2013.01); *H01L 2924/35121* (2013.01)

(56) References Cited

U.S. PATENT DOCUMENTS

2016/0211195 A1    7/2016  Sunachi et al.
2018/0366449 A1*  12/2018  Ikenouchi ......... H01L 23/49833

FOREIGN PATENT DOCUMENTS

JP    2015-053414 A     3/2015
JP    2015-216314 A    12/2015
WO    2015/114987 A1    8/2015

OTHER PUBLICATIONS

May 27, 2020 Extended Search Report issued in European Patent Application No. 18814130.3.

* cited by examiner

[Fig. 1]
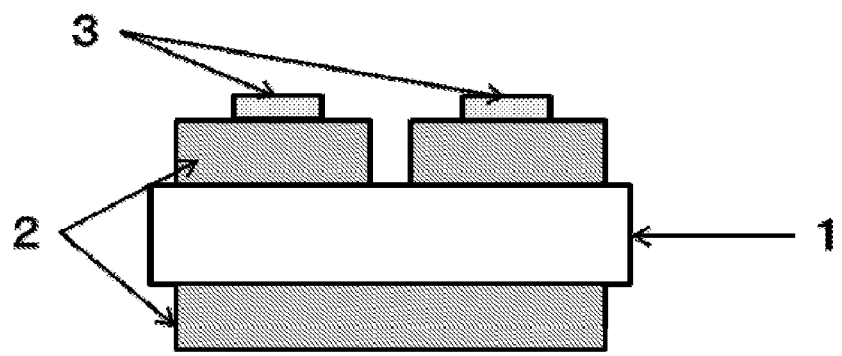
[Fig. 2]
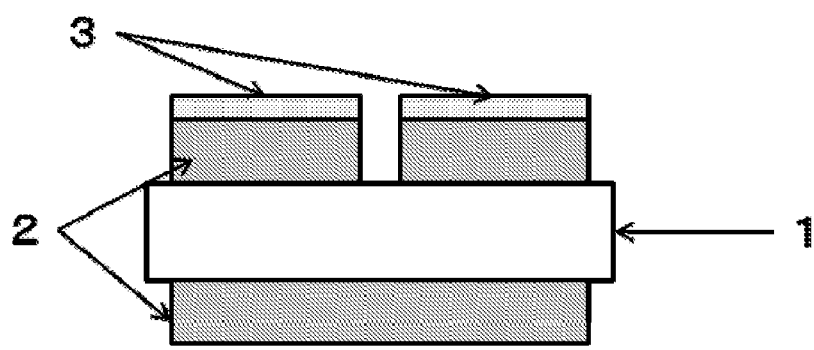
[Fig. 3]
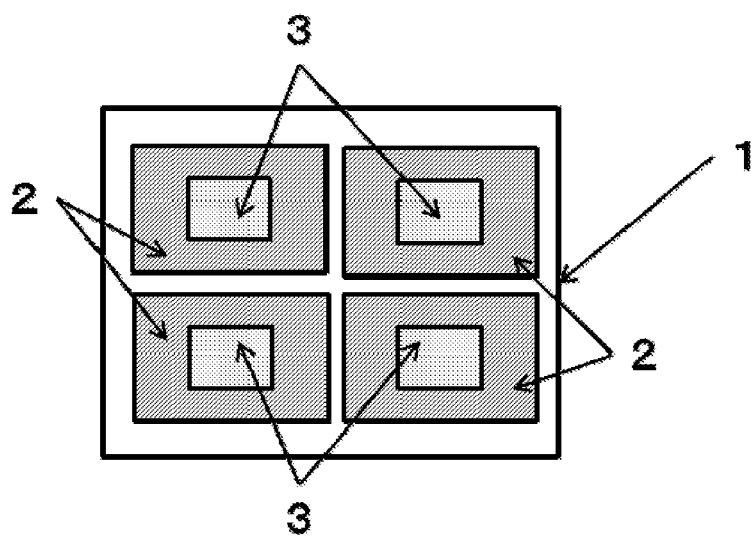

US 11,430,727 B2

CERAMIC CIRCUIT SUBSTRATE

TECHNICAL FIELD

The present invention relates to a ceramic circuit substrate.

BACKGROUND ART

As substrates for circuits used in power modules, and the like, ceramic substrates composed of ceramics such as alumina, beryllia, silicon nitride, and aluminum nitride are used in view of the thermal conductivity, cost, safety, and the like. These ceramic substrates are used as circuit substrates by bonding metal circuit boards and heat dissipation plates composed of copper, aluminum, and the like, thereto. These have excellent insulating properties, heat dissipation properties, and the like, relative to resin substrates or metal substrates having resin layers as insulating materials. Thus, they are used as substrates for mounting high-heat-dissipation electronic components.

In power module applications such as elevators, vehicles, and hybrid cars, it is common to use ceramic circuit substrates in which a metal circuit board is bonded, with a braze material, to the surface of a ceramic substrate, and semiconductor elements are further mounted at prescribed positions on the metal circuit board. In recent years, in order to deal with the increased amounts of heat generated by semiconductor elements due to the higher integration, higher frequencies, and higher output power of semiconductor elements, ceramic substrates composed of aluminum nitride sintered bodies or silicon nitride sintered bodies, which have high thermal conductivity, are being used.

In addition, since ceramic circuit substrates and semiconductor elements are bonded by bonding methods using conventional Sn-based solders, there is expected to be a problem of a reduction in reliability due to the solder re-melting with the increased heat generated because of higher output, etc. Furthermore, regarding SiC for which there are hopes for use in future high-efficient devices, drive temperatures are 250° C. or higher, and even higher temperatures than those of Si are predicted. Thus, there is a need to apply mounting technology that deals with even high temperatures.

In order to solve these technical problems, there have been investigations into techniques for bonding using nanoparticles such as silver, etc. It is known that by setting metal particles to be several nm in size, the apparent melting point thereof becomes lower than that of a bulk material. Thus, it is thought that bonding below the melting point is possible, and furthermore, that, after bonding, fusing up to the melting point of the particulate material may become an irreversible phenomenon (Patent Document 1).

It can be anticipated that there will be applications in devices which target high thermal resistance and high heat dissipation properties by silver nanoparticle bonding of semiconductor elements.

Regarding substances to be bonded by silver nanoparticle bonding, it is known that bonding is easier and bonding strength is higher for silver plated surfaces than for pure copper surfaces.

Although silver plating the entire surface of the copper parts of a ceramic circuit substrate can be easily carried out, silver is extremely reactive with sulfur.

Furthermore, silver plated surfaces do not have excellent close adhesiveness with a power module sealing resin such as EMC, or the like, and this may lead to a decrease in the performance or reliability of a power module.

CITATION LIST

Patent Literature

Patent Document 1: JP 2011-080147 A

SUMMARY OF INVENTION

Technical Problem

The problem of the present invention is to provide a circuit substrate which has migration resistance and improved close adhesiveness with a module sealing resin.

Solution to Problem

The present inventors performed diligent investigations in order to achieve the objective mentioned above. As a result thereof, it was discovered that when conductor sides are subjected to silver plating, short circuits may occur between conductors due to migration of silver, and further, that pores readily form in a resin due to the conductor side surfaces becoming an inclined shape. A technique which improves anti-migration and close adhesiveness with a module sealing resin was established by setting a structure in which the silver plating is removed from the side surfaces.

In other words, the present invention is a ceramic circuit substrate having a copper plate bonded, by a braze material, to both main surfaces of a ceramic substrate comprising aluminum nitride or silicon nitride, the copper plate of at least one of the main surfaces being subjected to silver plating, wherein: the copper plate side surfaces are not subjected to silver plating; the thickness of the silver plating is 0.1 µm to 1.5 µm; and the arithmetic mean roughness Ra of the surface roughness of the circuit substrate after silver plating is 0.1 µm to 1.5 µm.

Advantageous Effects of Invention

The present invention provides a ceramic circuit substrate to which semiconductor elements are easily silver nanoparticle bonded and which has migration resistance and high close adhesiveness with a module sealing resin.

BRIEF DESCRIPTION OF DRAWINGS

FIG. 1 shows an example of a cross-section view of a ceramic circuit substrate.

FIG. 2 shows an example of a cross-section view of a ceramic circuit substrate.

FIG. 3 shows a planar view of a ceramic circuit substrate (planar view of FIG. 1).

DESCRIPTION OF EMBODIMENTS

[Ceramic Circuit Substrate]

The present invention is a ceramic circuit substrate having a copper plate bonded, by a braze material, to both main surfaces of a ceramic substrate comprising aluminum nitride or silicon nitride, the copper plate of at least one of the main surfaces being subjected to silver plating, wherein: the copper plate side surfaces are not subjected to silver plating; the thickness of the silver plating is 0.1 µm to 1.5 µm; and the arithmetic mean roughness Ra of the surface roughness of the circuit substrate after silver plating is 0.1 μm to 1.5 μm.

The ceramic substrate that is used in the ceramic circuit substrate of the present invention is not particularly limited, and it is possible to use a nitride ceramic such as silicon nitride or aluminum nitride, an oxide ceramic such as aluminum oxide or zirconium oxide, a carbide ceramic such as silicon carbide, or a boride ceramic such as lanthanum boride. However, a non-oxide ceramic such as aluminum nitride or silicon nitride is favorable for bonding a metal plate to a ceramic substrate by an active metal method, and furthermore, a silicon nitride substrate is preferable for the purpose of obtaining excellent mechanical strength and fracture toughness.

In one embodiment of the present invention, the thickness of the ceramic substrate is not particularly limited, but is generally about 0.1 to 3.0 mm. In particular, considering the decrease in the thermal resistance of the circuit substrate overall, it is preferably 1.0 mm or less.

In one embodiment of the present invention, the metal that is used in the metal plate is not particularly limited as long as it is a metal for which an active metal method can be applied, such as copper, aluminum, iron, nickel, chromium, silver, molybdenum, or cobalt, used singly or as an alloy. In particular, copper is preferred from the perspective of conductivity and heat dissipation properties.

In one embodiment of the present invention, the purity of the copper plate is preferably 90% or higher. By setting the purity to be 90% or higher, the reaction between the copper plate and the braze material can be kept from being insufficient when bonding the copper plate to the ceramic substrate, and the copper plate can be kept from becoming hard and thereby lowering the reliability of the circuit substrate.

In one embodiment of the present invention, the thickness of the copper plate is not particularly limited, but is generally about 0.1 to 1.5 mm. In particular, in view of the heat dissipation properties, it is preferably 0.3 mm or more, more preferably 0.5 mm or more, and even more preferably 0.8 mm or more.

The thickness of the silver plating is preferably 0.1 μm to 1.5 μm and more preferably 0.3 μm to 1.0 μm. At a thickness of less than 0.1 μm, portions which are partially not silver plated arise, gaps are formed between a semiconductor and a copper body during semiconductor element bonding, and thermal resistance decreases. Further, at a thickness of 1.5 μm or more, the close adhesiveness of the silver plating may decrease.

The arithmetic mean roughness Ra of the silver plated surface is preferably 0.1 μm to 1.5 μm and more preferably 0.1 μm to no greater than 1.0 μm. At a roughness of less than 0.1 processing of the copper surface is required and production costs become high. At a roughness exceeding 1.5 close adhesiveness between the semiconductor elements and the silver plating may decrease.

Further, for a ceramic circuit substrate of one embodiment of the present invention, using a substrate that includes a comb-shaped electrode comprising a distance between patterns of 0.5 mm, the insulation resistance between patterns, after applying 1 kV DC for 500 hr in a constant-temperature constant-humidity chamber under an atmosphere of 85° C. and 93% RH, is preferably $1\times10^6 \Omega$ or more.

Furthermore, the shear stress of a ceramic circuit substrate of one embodiment of the present invention, measured using a tensile tester after sandwiching an EMC resin between two circuit substrates and curing, is preferably a value of 20 kg/cm$^2$ or more.

[Method for Producing Ceramic Circuit Substrate]

The method for producing the ceramic circuit substrate of the present invention is a production method which involves carrying out electroless silver plating.

Thin film-formation is possible by silver plating, but electroless plating is preferred for its ability to further reduce film thickness variation within a surface.

Conductor surfaces which are to be subjected to silver plating may be partially silver plated as shown in FIG. 1 or may be entirely silver plated as show in FIG. 2, but from the perspective of plating costs, partial plating is preferred.

As a method for obtaining a structure in which conductor side surfaces are not subjected to silver plating, it is possible to employ a method in which circuit formation is carried out after a silver plating process or a method in which a desilvering process is carried out after circuit formation.

EMC resins have excellent close adhesiveness with metal surface oxide films and therefore, close adhesiveness is more easily obtained with a copper surface than with precious metals, such as silver, which do not readily form oxide films.

EXAMPLES

Hereinafter, the present invention will be explained in detail by referring to examples. However, the scope of the present invention is not limited to the examples below.

EXAMPLES

After coating, with a bonding material comprising silver and copper as main components, both main surfaces of a silicon nitride substrate having a thickness of 0.32 mm and an external size of 50 mm×50 mm, the substrate was laminated by being sandwiched by oxygen-free copper C1020 plates. This laminated body was heated in a vacuum while also having pressure applied thereto to produce a copper-ceramic bonded body.

A UV-cured type plating resist was applied to portions of the copper plates, which were not to be subjected to silver plating, on the surface and underside of the obtained bonded body. The surface roughness after silver plating was adjusted by carrying out a silver plating pre-treatment on portions where copper was exposed. Then, silver plating having a thickness of 0.1 μm to 1.5 μm was applied by carrying out an electroless silver plating process for a predetermined time. The plating resist was removed using an alkaline aqueous solution to produce a copper-ceramic bonded body with silver partially disposed thereon.

A UV-cured type etching resist was applied to the circuit pattern on the surface side copper plate of the obtained bonded body using screen printing. Further, using screen printing, etching resist was applied to the underside copper plate so as to mask the entirety thereof and ensure that it was not etched. The etching process was carried out using a CuCl$_2$ solution, with unnecessary portions being removed by dissolving, to form a copper circuit pattern.

The obtained copper circuit substrate was immersed in an alkaline aqueous solution and the etching resist was removed to produce a circuit substrate having a structure in which conductor surfaces had been subjected to silver plating and side surfaces had not been subjected to silver plating.

After bonding, using silver nanoparticles, Si chips on the silver plating of the obtained ceramic circuit substrate, the ceramic circuit substrate was modularized by soldering a copper base plate to the substrate underside surface.

COMPARATIVE EXAMPLES

By shortening the processing time of the electroless silver plating of the examples, circuit substrates having a thin film silver plating were produced, and by lengthening the processing time, circuit substrates having a thick film silver plating were produced.

Circuit substrates in which the plating resist of the examples was not applied and entire copper surfaces were subjected to silver plating were produced.

Circuit substrates in which a silver plating process was carried out after circuit formation and conductor side surfaces were subjected to silver plating were produced.

<Measurement of Silver Plating Thickness>

The thickness of the silver plating was measured, in a range of 50 μm in length, in a plurality of substrates by cross-section SEM observation at a magnification of 5,000 times to 10,000 times, and the average value thereof was defined as the silver plating thickness.

<Measurement of Arithmetic Mean Roughness of Surface Roughness>

The surface roughness was measured, using an SJ-301 device (manufactured by Mitutoyo Corporation) and a standard length of 0.8 mm, at a plurality of locations on the silver plated surface, and the average value thereof was defined as the arithmetic mean roughness of the surface roughness.

<Evaluation of Silver Plating Close Adhesiveness>

For silver plating close adhesiveness, a sharp blade was used to make incisions in the plated surface reaching as far as the base material so as to make a 2 mm square shape; a tape having adhesive strength was stuck thereto; and an investigation into the presence or absence of peeling was carried out by rapidly and strongly tearing away the tape.

<Migration Evaluation>

For migration evaluation, using a substrate including a comb-shaped electrode comprising a distance between patterns of 0.5 mm, 1 kV DC was applied for 500 hr in a constant-temperature constant-humidity chamber under an atmosphere of 85° C. and 93% RH. Next, insulation resistance was measured between patterns, and separated into two ranks as follows.

O: ≥1×10⁶Ω; X: <1×10⁶Ω

<Evaluation of Close Adhesiveness with EMC Resin>

For an evaluation of close adhesiveness with EMC resin, after sandwiching an EMC resin between two circuit substrates and curing, shear stress was measured using a tensile tester, and separated into two ranks as follows.

O: ≥20 kg/cm²; X: <20 kg/cm²

The evaluation results are summarized in Table 1.

TABLE 1

| | No | SIDE SURFACE SILVER PLATING | SILVER PLATING THICKNESS (μm) | ARITHMETIC MEAN ROUGHNESS Ra (μm) | PLATING CLOSE ADHESIVENESS | MIGRATION EVALUATION (Ω) | CLOSE ADHESIVENESS WITH EMC RESIN (*) (kg/cm²) | JUDGMENT |
|---|---|---|---|---|---|---|---|---|
| EXAMPLES | 1 | N | 0.14 | 0.19 | NO PEELING | $4.2 \times 10^{11}$ | 25.2 | o |
| | 2 | N | 0.20 | 0.28 | NO PEELING | $5.6 \times 10^{11}$ | 26.3 | o |
| | 3 | N | 0.28 | 0.36 | NO PEELING | $2.2 \times 10^{11}$ | 27.7 | o |
| | 4 | N | 0.41 | 0.46 | NO PEELING | $7.5 \times 10^{11}$ | 27.2 | o |
| | 5 | N | 0.55 | 0.59 | NO PEELING | $6.9 \times 10^{11}$ | 26.2 | o |
| | 6 | N | 0.63 | 0.77 | NO PEELING | $3.1 \times 10^{11}$ | 24.5 | o |
| | 7 | N | 0.82 | 0.98 | NO PEELING | $8.8 \times 10^{11}$ | 25.5 | o |
| | 8 | N | 0.97 | 1.01 | NO PEELING | $4.6 \times 10^{11}$ | 23.5 | o |
| | 9 | N | 1.25 | 1.33 | NO PEELING | $5.1 \times 10^{11}$ | 22.2 | o |
| | 10 | N | 1.48 | 1.45 | NO PEELING | $3.6 \times 10^{11}$ | 20.2 | o |
| | 11 | N | 0.12 | 0.15 | NO PEELING | $4.2 \times 10^{11}$ | 25.8 | o |
| | 12 | N | 1.01 | 1.18 | NO PEELING | $6.2 \times 10^{11}$ | 24.1 | o |
| | 13 | N | 1.39 | 1.42 | NO PEELING | $5.5 \times 10^{11}$ | 21.1 | o |
| COMPARATIVE EXAMPLES | 14 | Y | 0.31 | 0.43 | NO PEELING | $0.5 \times 10^{6}$ | 15.2 | x |
| | 15 | Y | 0.59 | 0.69 | NO PEELING | $0.4 \times 10^{6}$ | 12.1 | x |
| | 16 | N | 0.03 (PARTIALLY NOT PLATED) | 0.13 | — | — | — | x |
| | 17 | N | 0.06 (PARTIALLY NOT PLATED) | 0.15 | — | — | — | x |
| | 18 | N | 1.68 | 1.79 | PEELING | — | — | x |
| | 19 | N | 1.77 | 1.85 | PEELING | — | — | x |
| | 20 | Y | 0.55 | 0.63 | NO PEELING | $0.6 \times 10^{6}$ | 13.3 | x |

(*) FOR ITEMS HAVING NO SIDE SURFACE SILVER PLATING, CLOSE ADHESIVENESS BETWEEN A SURFACE WHERE COPPER IS EXPOSED AND EMC WAS EVALUATED.
FOR ITEMS HAVING SIDE SURFACE SILVER PLATING, CLOSE ADHESIVENESS BETWEEN A SILVER PLATED SURFACE AND EMC WAS EVALUATED.
"—" SYMBOL MEANS NOT EVALUATED

As shown in Table 1, by setting a structure in which conductor surfaces are subjected to silver plating and side surfaces are not subjected to silver plating, there were confirmed to be anti-migration properties and high close adhesiveness with a module sealing resin.

REFERENCE SIGNS LIST

1 Ceramic substrate
2 Copper plate
3 Silver plating

The invention claimed is:

1. A ceramic circuit substrate having a copper plate bonded, by a braze material, to both main surfaces of a ceramic substrate comprising aluminum nitride or silicon nitride, the copper plate of at least one of the main surfaces being directly subjected to silver plating, wherein: the copper plate side surfaces are not subjected to silver plating; the thickness of the silver plating is 0.1 μm to 1.5 μm; the arithmetic mean roughness Ra of the surface roughness of the circuit substrate after silver plating is 0.1 µm to 1.5 µm; and the copper plate has a thickness of 0.8 mm or more.

2. A method for producing the ceramic circuit substrate as in claim 1, wherein the method involves carrying out electroless silver plating.

3. A power module in which semiconductor elements are bonded, using silver nanoparticles, on the silver plating of the ceramic circuit substrate as in claim 1.

4. The ceramic circuit substrate as in claim 1, which has a thickness of about 0.1 to 3.0 mm.

5. The ceramic circuit substrate as in claim 4, wherein the thickness is 1.0 mm or less.

6. The ceramic circuit substrate as in claim 1, wherein the copper plate has a thickness of 0.8 to 1.5 mm.

7. The ceramic circuit substrate as in claim 1, wherein the thickness of the silver plating is 0.3 µm to 1.0 µm.

8. The ceramic circuit substrate as in claim 1, wherein the arithmetic mean roughness Ra of the surface roughness of the circuit substrate after silver plating is 0.1 µm to 1.0 µm.

9. The ceramic circuit substrate as in claim 1, wherein the arithmetic mean roughness Ra of the surface roughness of the circuit substrate after silver plating is 0.1 µm to 0.46 µm.

10. The ceramic circuit substrate as in claim 1, wherein the arithmetic mean roughness Ra of the surface roughness of the circuit substrate after silver plating is 0.1 µm to 0.36 µm.

* * * * *